(12) United States Patent
Makala et al.

(10) Patent No.: US 11,139,272 B2
(45) Date of Patent: Oct. 5, 2021

(54) BONDED ASSEMBLY CONTAINING OXIDATION BARRIERS AND/OR ADHESION ENHANCERS AND METHODS OF FORMING THE SAME

(71) Applicant: SANDISK TECHNOLOGIES LLC, Addison, TX (US)

(72) Inventors: Raghuveer S. Makala, Campbell, CA (US); Johann Alsmeier, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 10 days.

(21) Appl. No.: 16/523,029

(22) Filed: Jul. 26, 2019

(65) Prior Publication Data
US 2021/0028149 A1    Jan. 28, 2021

(51) Int. Cl.
*H01L 25/00*   (2006.01)
*H01L 23/00*   (2006.01)
*H01L 25/065*  (2006.01)

(52) U.S. Cl.
CPC .......... *H01L 25/0657* (2013.01); *H01L 24/08* (2013.01); *H01L 24/89* (2013.01); *H01L 25/50* (2013.01); *H01L 2224/0568* (2013.01); *H01L 2224/05647* (2013.01); *H01L 2224/05655* (2013.01); *H01L 2224/05657* (2013.01); *H01L 2224/05684* (2013.01);
(Continued)

(58) Field of Classification Search
CPC . H01L 2224/80048; H01L 2224/80895; H01L 2224/8002; H01L 2224/80896
See application file for complete search history.

(56) References Cited

U.S. PATENT DOCUMENTS 8,802,538 B1    8/2014  Liu et al.
10,115,681 B1   10/2018 Ariyoshi
(Continued)

FOREIGN PATENT DOCUMENTS

KR    10-2014-0017446 A    2/2014

OTHER PUBLICATIONS

Notification of Transmittal of the International Search Report and Written Opinion of the International Search Authority for International Patent Application No. PCT/US2020/024580, dated Jul. 29, 2020, 10 pages.
(Continued)

*Primary Examiner* — Fernando L Toledo
*Assistant Examiner* — Valerie N Newton
(74) *Attorney, Agent, or Firm* — The Marbury Law Group PLLC

(57) ABSTRACT

A method of forming a bonded assembly includes providing a first semiconductor die containing a first substrate, first semiconductor devices, and first bonding pads that are electrically connected to a respective node of the first semiconductor devices, forming a first oxidation barrier layer on physically exposed surfaces of the first bonding pads, providing a second semiconductor die containing a second substrate, second semiconductor devices, and second bonding pads that are electrically connected to a respective node of the second semiconductor devices, and bonding the second bonding pads to the first bonding pads with at least the first oxidation barrier layer located between the respective first and second bonding pads.

16 Claims, 10 Drawing Sheets

(52) U.S. Cl.
CPC .............. *H01L 2224/08147* (2013.01); *H01L 2224/8002* (2013.01); *H01L 2224/80048* (2013.01); *H01L 2224/80895* (2013.01); *H01L 2224/80896* (2013.01); *H01L 2924/0529* (2013.01)

(56) References Cited

U.S. PATENT DOCUMENTS

| | | | |
|---|---|---|---|
| 10,283,243 B2 | 5/2019 | Nishida | |
| 10,354,980 B1 | 7/2019 | Mushiga et al. | |
| 10,354,987 B1 | 7/2019 | Mushiga et al. | |
| 2003/0111441 A1* | 6/2003 | Jerominek | H01L 24/97 216/39 |
| 2003/0230799 A1 | 12/2003 | Yee et al. | |
| 2004/0041393 A1 | 3/2004 | Lee | |
| 2005/0023703 A1 | 2/2005 | Sebesta et al. | |
| 2005/0186704 A1 | 8/2005 | Yee et al. | |
| 2006/0087039 A1 | 4/2006 | Cheng et al. | |
| 2006/0128142 A1* | 6/2006 | Whelan | H01L 21/76826 438/638 |
| 2006/0289989 A1 | 12/2006 | Yee et al. | |
| 2007/0148912 A1 | 6/2007 | Morita et al. | |
| 2009/0001557 A1 | 1/2009 | Renavikar et al. | |
| 2009/0039499 A1 | 2/2009 | Chainer | |
| 2009/0051036 A1 | 2/2009 | Abbott | |
| 2009/0302459 A1 | 12/2009 | Chainer | |
| 2011/0084403 A1* | 4/2011 | Yang | H01L 24/08 257/777 |
| 2011/0156251 A1 | 6/2011 | Chu et al. | |
| 2011/0165732 A1 | 7/2011 | Abbott | |
| 2011/0221059 A1 | 9/2011 | Tang et al. | |
| 2011/0226841 A1 | 9/2011 | Wei et al. | |
| 2011/0312131 A1 | 12/2011 | Renavikar et al. | |
| 2013/0161816 A1 | 6/2013 | Chu et al. | |
| 2014/0175655 A1 | 6/2014 | Chen et al. | |
| 2014/0246770 A1 | 9/2014 | Jha et al. | |
| 2014/0339700 A1* | 11/2014 | Ren | H01L 23/53252 257/751 |
| 2015/0228575 A1 | 8/2015 | Sameshima | |
| 2015/0258769 A1 | 9/2015 | Farah | |
| 2017/0062366 A1* | 3/2017 | Enquist | H01L 24/05 |
| 2017/0133296 A1 | 5/2017 | Jha et al. | |
| 2017/0200691 A1 | 7/2017 | Fujino et al. | |
| 2019/0051628 A1 | 2/2019 | Liu et al. | |
| 2019/0221557 A1 | 7/2019 | Kim et al. | |
| 2020/0051945 A1* | 2/2020 | Pan | H01L 25/16 |

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).

S. Suzuki et al., "Native Oxide layers formed on the surface of ultra high-purity iron and copper investigated by angle resolved XPS", Materials Transactions, JIM, vol. 38, 1004-1009 (1997).

C.G. Kang et al., "Effects of multi-layer graphene capping on Cu interconnects", Nanotechnology 24, 115707, 6 pages (2013).

J. Kwak et al., "Oxidation behavior of graphene-coated copper at intrinsic graphene defects of different origins", Nature Communications. 8, 1549, 12 pages (2017).

M. Zhang et al., "Selective LPCVD growth of graphene on patterened copper and its growth mechanism", Applied Physics Letters, 109, 253109 (2016), 6 pages.

C-H Yeh et al., "Scalable Graphite/Copper Bi-shell Composite for High-Performance Interconnects", ACS Nano, vol. 8(1), 275-282 (2014).

C. Liu et al., "Fluxless Soldering of Copper Substrates Using Self-Assembled Monolayers for Preservation", IEEE Transactions on Components and Packaging Technologies, vol. 29, No. 3, Sep. 2006, 10 pages.

D.D. Gandhi et al., "Annealing-induced interfacial toughening using a molecular nanolayer", Nature, vol. 447, 299-302 (May 2007).

M.M, Sung et al., "Self-Assembled Monolayers of Alkanethiols on Clean Copper Surfaces", Bull. Korean Chem. vol. 22, No. 7, pp. 748-752 (2001).

D.D. Gandhi et al., "Copper Diffusion and mechanical toughness at Cu-silica interfaces glued with polyelectrolyte nanolayers", Journal of Applied Physics. 101, 084505, (2007) 5pages.

U.S. Appl. No. 15/960,267, filed Apr. 23, 2018, SanDisk Technologies LLC.

U.S. Appl. No. 16/284,502, filed Feb. 25, 2019, SanDisk Technologies LLC.

U.S. Appl. No. 16/278,372, filed Feb. 18, 2019, SanDisk Technologies LLC.

U.S. Appl. No. 16/295,292, filed Mar. 7, 2019, SanDisk Technologies LLC.

U.S. Appl. No. 16/385,010, filed Apr. 16, 2019, SanDisk Technologies LLC.

U.S. Appl. No. 16/409,593, filed May 10, 2019, SanDisk Technologies LLC.

U.S. Appl. No. 15/892,648, filed Feb. 9, 2018, SanDisk Technologies LLC.

U.S. Appl. No. 15/979,885, filed May 15, 2018, SanDisk Technologies LLC.

U.S. Appl. No. 16/248,923, filed Jan. 16, 2019, SanDisk Technologies LLC.

U.S. Appl. No. 16/231,752, filed Dec. 24, 2018, SanDisk Technologies LLC.

U.S. Appl. No. 16/274,687, filed Feb. 13, 2019, SanDisk Technologies LLC.

U.S. Appl. No. 16/291,457, filed Mar. 4, 2019, SanDisk Technologies LLC.

U.S. Appl. No. 16/291,594, filed Mar. 4, 2019, SanDisk Technologies LLC.

U.S. Appl. No. 16/291,577, filed Mar. 4, 2019, SanDisk Technologies LLC.

U.S. Appl. No. 16/242,216, filed Jan. 8, 2019, SanDisk Technologies LLC.

U.S. Appl. No. 16/255,413, filed Jan. 23, 2019, SanDisk Technologies LLC.

U.S. Appl. No. 16/249,423, filed Jan. 16, 2019, SanDisk Technologies LLC.

U.S. Appl. No. 16/269,301, filed Feb. 6, 2019, SanDisk Technologies LLC.

U.S. Appl. No. 16/275,668, filed Feb. 14, 2019, SanDisk Technologies LLC.

U.S. Appl. No. 16/288,656, filed Feb. 28, 2019, SanDisk Technologies LLC.

U.S. Appl. No. 16/372,908, filed Apr. 2, 2019, SanDisk Technologies LLC.

U.S. Appl. No. 16/417,913, filed May 21, 2019, SanDisk Technologies LLC.

U.S. Appl. No. 16/391,632, filed Apr. 23, 2019, SanDisk Technologies LLC.

U.S. Appl. No. 16/440,183, filed Jun. 13, 2019, SanDisk Technologies LLC.

U.S. Appl. No. 16/521,849, filed Jul. 25, 2019, SanDisk Technologies LLC.

\* cited by examiner

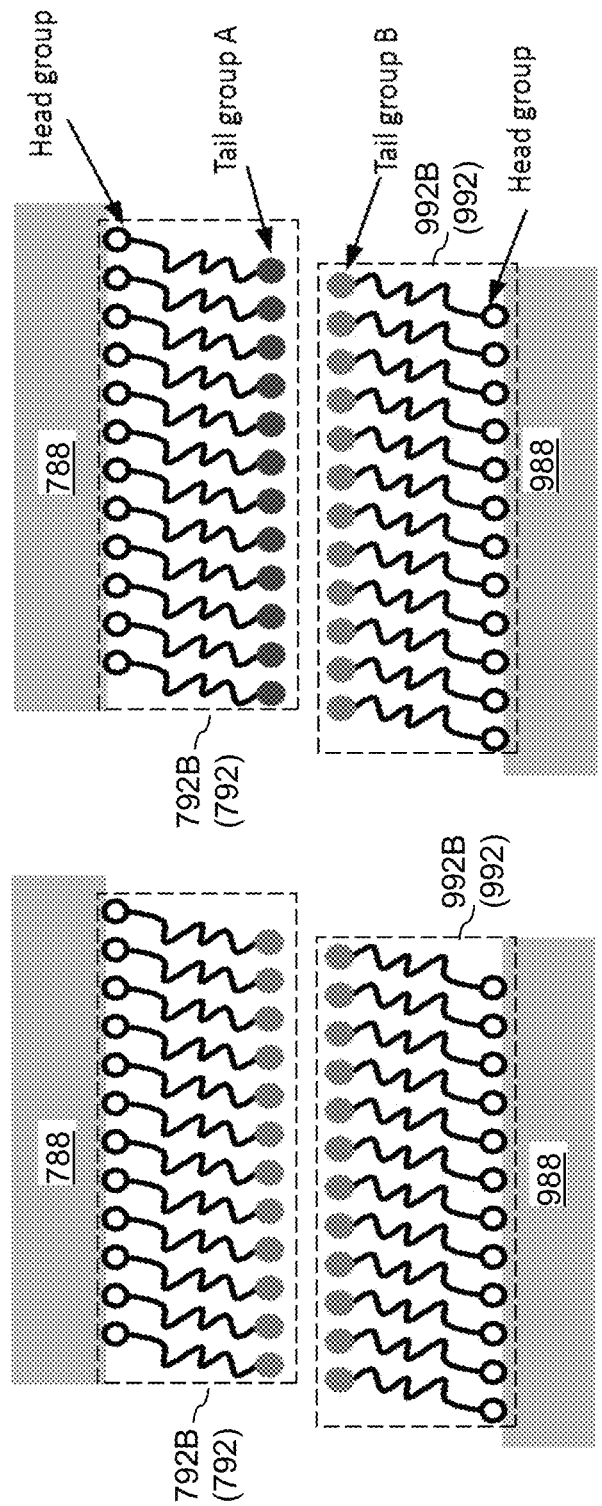

BONDED ASSEMBLY CONTAINING OXIDATION BARRIERS AND/OR ADHESION ENHANCERS AND METHODS OF FORMING THE SAME

FIELD

The present disclosure relates generally to the field of semiconductor devices, and particularly to a bonded assembly containing oxidation barriers and/or adhesion enhancers for metal-to-metal or hybrid bonded wafers and methods for forming the same.

BACKGROUND

A three-dimensional memory device including three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a method of forming a bonded assembly includes providing a first semiconductor die containing a first substrate, first semiconductor devices, and first bonding pads that are electrically connected to a respective node of the first semiconductor devices, forming a first oxidation barrier layer on physically exposed surfaces of the first bonding pads, providing a second semiconductor die containing a second substrate, second semiconductor devices, and second bonding pads that are electrically connected to a respective node of the second semiconductor devices, and bonding the second bonding pads to the first bonding pads with at least the first oxidation barrier layer located between the respective first and second bonding pads.

According to another embodiment of the present disclosure, a bonded assembly comprises a first semiconductor die comprising a first substrate, first semiconductor devices, and first bonding pads that are electrically connected to a respective node of the first semiconductor devices, and a second semiconductor die comprising a second substrate, second semiconductor devices, and second bonding pads that are electrically connected to a respective node of the second semiconductor devices, wherein each of the second bonding pads is bonded to a respective one of the first bonding pads. Each bonded pair of a first bonding pad and a second bonding pad includes an interfacial region that includes volumes that are within 10 nm from an interface between the first bonding pad and the second bonding pad; and each interfacial region has an average volume carbon density that is greater than $1.0 \times 10^{16}/cm^3$.

BRIEF DESCRIPTION OF THE DRAWINGS

FIG. 7A is a magnified view of a mating pair of a first bonding pad and a second bonding pad at the processing step of FIG. 5 in a second configuration in which the first and second carbon-based oxidation barrier layers comprise self-assembly materials.

FIG. 7B is a magnified view of a mating pair of a first bonding pad and a second bonding pad at the processing step of FIG. 5 in a third configuration in which the first and second carbon-based oxidation barrier layers comprise self-assembly materials.

DETAILED DESCRIPTION

Figure 1:
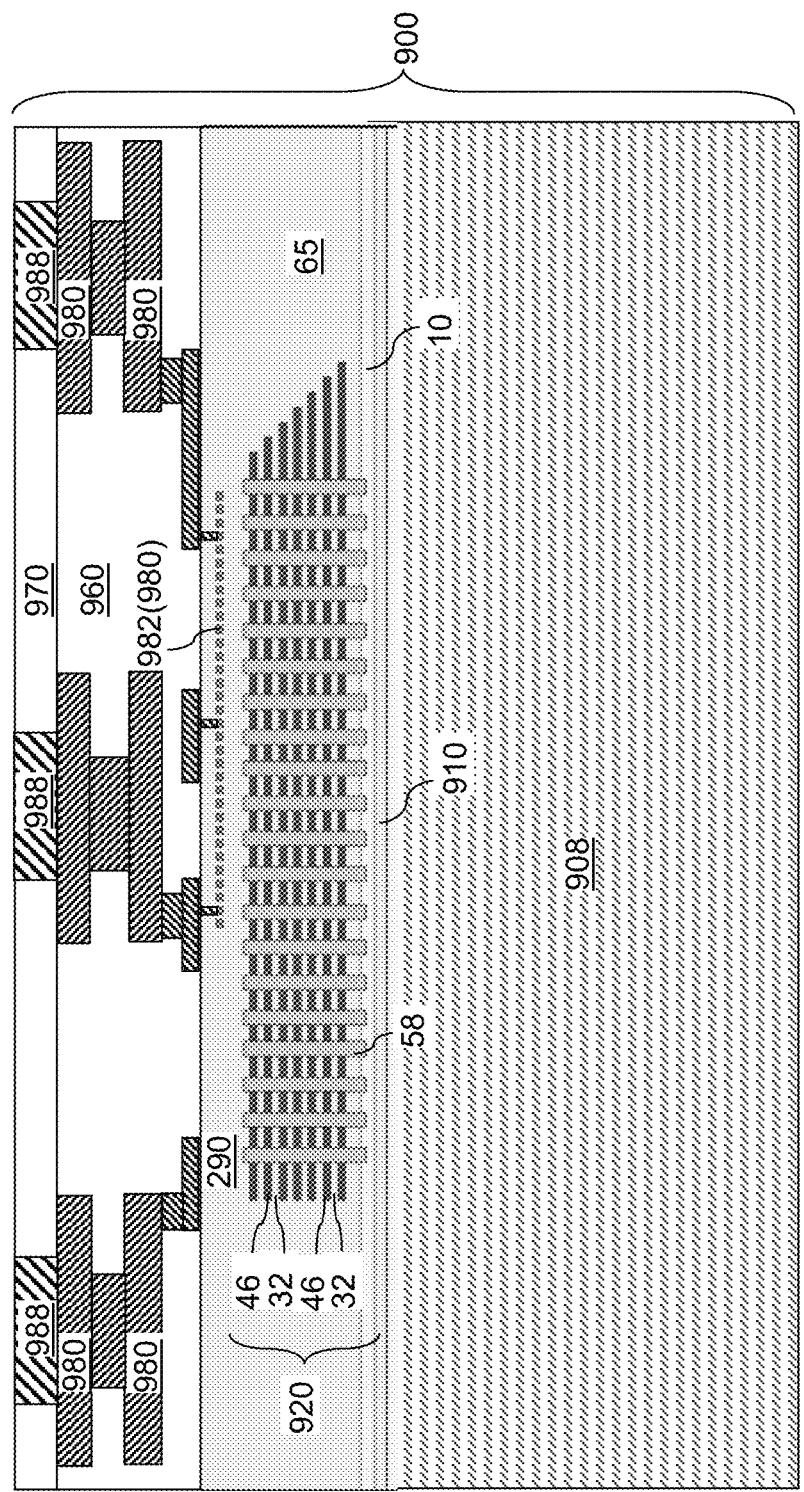
FIG. 1 is a schematic vertical cross-sectional view of a first semiconductor die after formation of a first bonding dielectric layer and first bonding pads according to an embodiment of the present disclosure.

Hybrid wafer-to-wafer bonding utilizes chemical bond formation between pad dielectric material layers and between electrically conductive bonding pads of opposing wafers. Metal-to-metal bonding utilizes bond formation between electrically conductive bonding pads of opposing wafers. The present inventors determined that in both types of bonding, the exposed surfaces of electrically conductive bonding pads, such as copper bonding pads for example, readily oxidize prior to bonding to form a metal oxide (e.g., copper oxide) interlayer at the bonding interface. The metal oxide interlayer increases the resistivity of the bond between the electrically conductive bonding pads of opposing wafers.

In some embodiments of the present disclosure an oxidation barrier is formed on at least one bonding pad to reduce or eliminate a formation of the metal oxide interlayer at the bonding interface. In one embodiment, the oxidation barrier may comprise a carbon-containing material. The oxidation barrier may be used in a bonded assembly that is bonded by either hybrid bonding or metal-to-metal bonding, the various aspects of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first semiconductor die 900 according to an embodiment of the present disclosure is illustrated. The first semiconductor die 900 includes a first substrate 908, first semiconductor devices 920 overlying the first substrate 908, first dielectric material layers (290, 960, 970) overlying the first semiconductor devices, and first metal interconnect structures 980 embedded in the first dielectric material layers (290, 960, 970). In one embodiment, the first substrate 908 may be a commercially available silicon wafer having a thickness in a range from 500 microns to 1 mm.

Generally, the first semiconductor devices 920 may comprise any semiconductor device known in the art. In one embodiment, the first semiconductor die 900 comprises a memory die, and may include memory devices, such as a three-dimensional NAND memory device. In an illustrative example, the first semiconductor devices 920 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device.

A memory opening fill structure 58 may be formed within each memory opening. A memory opening fill structure 58 may include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc. The memory device may include an optional horizontal semiconductor channel layer 10 connected to the bottom end of each vertical semiconductor channel, and an optional dielectric spacer layer 910 that provides electrical isolation between the first substrate 908 and the horizontal semiconductor channel layer 10.

The electrically conductive layers 46 may be patterned to provide a terrace region in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46. Dielectric material portions 65 may be formed around each vertically alternating stack (32, 46) to provide electrical isolation among neighboring vertically alternating stacks (32, 46).

The first dielectric material layers (290, 960, 970) may include first contact-level dielectric layers 290 embedding contact via structures and bit lines 982, first interconnect-level dielectric layers 960 that embed a subset of the first metal interconnect structures 980 located above the first contact-level dielectric layers 290, and a first bonding dielectric layer 970 that is formed above the first interconnect-level dielectric layer 960. The bit lines 982 are a subset of the first metal interconnect structures 980 and may electrically contact drain regions located above the semiconductor channel at the top of the memory opening fill structures 58. The contact via structures contact various nodes of the first semiconductor devices. Interconnect metal lines and interconnect metal via structures, which are subsets of the first metal interconnect structures 980) may be embedded in the first interconnect-level dielectric layers 960. The first metal interconnect structures 980 may be located within the first interconnect-level dielectric layers 960 or within the first bonding dielectric layer 970.

Each of the first contact-level dielectric layers 290 and the first interconnect-level dielectric layers 960 may include a dielectric material such as undoped silicate glass, a doped silicate glass, organosilicate glass, silicon nitride, a dielectric metal oxide, or a combination thereof. The first bonding dielectric layer 970 may include, and/or consist essentially of, a silicon oxide material such as undoped silicate glass (e.g., silicon oxide) or a doped silicate glass. The thickness of the first bonding dielectric layer 970 may be in a range from 100 nm to 3,000 nm, although lesser and greater thicknesses may also be employed. The first bonding dielectric layer 970 may have a planar top surface, which may be provided, for example, by a planarization process such as a chemical mechanical polishing (CMP) process. A topmost layer of the first interconnect-level dielectric layers 960 may be a dielectric diffusion barrier layer (not expressly shown), which may be a silicon nitride layer having a thickness in a range from 10 nm to 300 nm.

First bonding pads 988 are formed in the first bonding dielectric layer 970, for example, by forming pad cavities in the first bonding dielectric layer 970 and filling the pad cavities with at least one conductive material. Alternatively, the bonding pads 988 are formed on the first metal interconnect structures 980 first, followed by forming the first bonding dielectric layer 970 over and around the first bonding pads 988, followed by planarizing the first bonding dielectric layer 970 to expose the top surface of the first bonding pads 988. The at least one conductive material may be a metallic (i.e., metal or metal alloy) material that may be bonded to the same metallic material or to another metallic material by metal-to-metal or hybrid bonding. For example, each of the first bonding pads 988 may include an optional metallic liner that includes TiN, TaN, and/or WN, and a metal fill material portion that includes the metallic material that may be bonded to the same metallic material or to another metallic material by metal-to-metal bonding. For example, the metal fill material portion may include, and/or consist essentially of, any material selected from Cu, a copper alloy including copper at an atomic concentration greater than 70% (which may be greater than 90% and/or 95%), or a cobalt or nickel alloy, such as CoW, CoWP, CoMoP, NiW, and/or NiWP.

Each of the first bonding pads 988 is surrounded by the first bonding dielectric layer 970 and contacts a respective underlying one of the first metal interconnect structures 980. Each of the first bonding pads 988 is electrically connected to a respective node of the first semiconductor devices 920.

Figure 2:
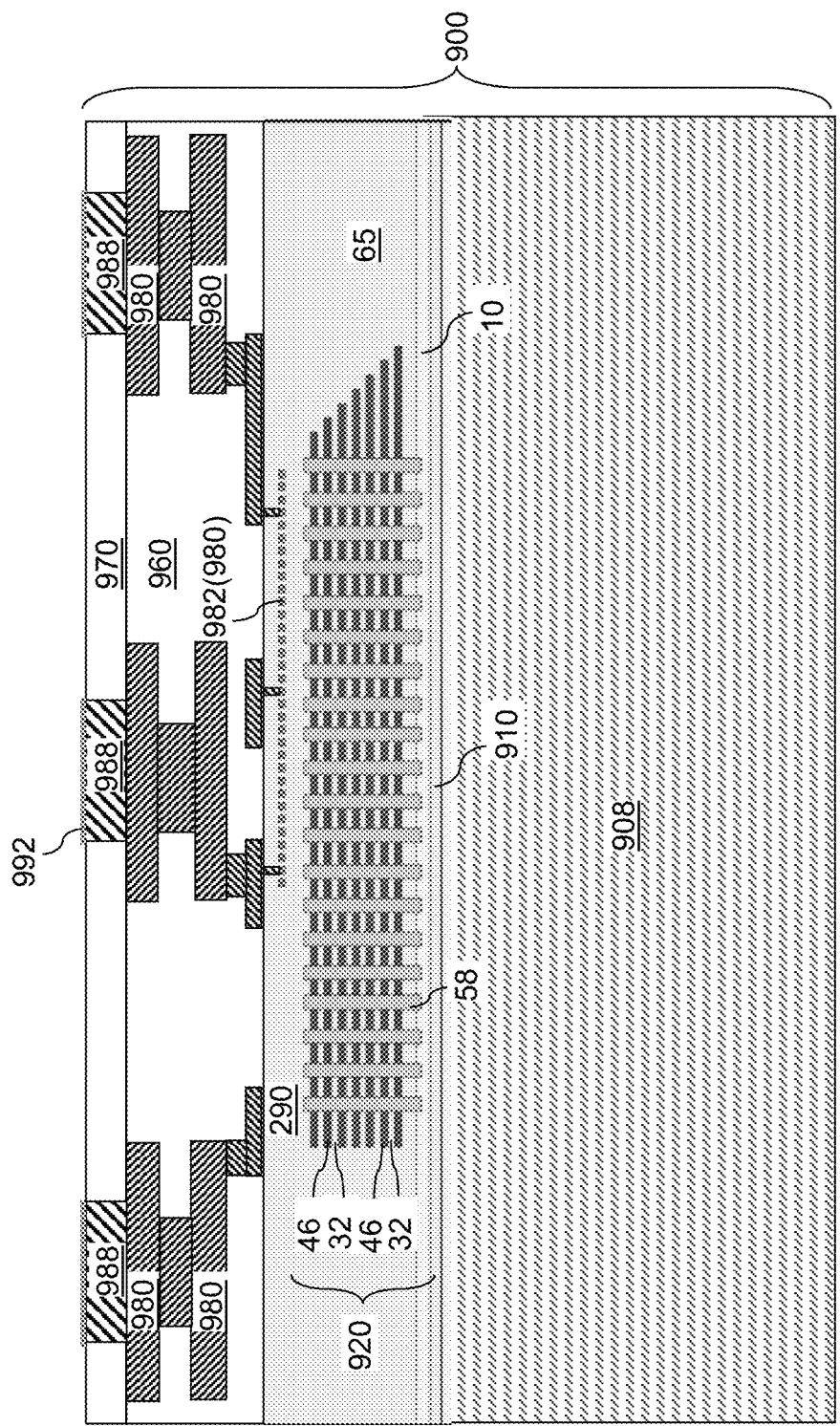
FIG. 2 is a schematic vertical cross-sectional view of the first semiconductor die after selective formation of a first carbon-based oxidation barrier layer according to an embodiment of the present disclosure.

Referring to FIG. 2, a first oxidation barrier layer 992 may be formed on the physically exposed surfaces (e.g., top surface) of the first bonding pads 988. The first oxidation barrier layer 992 may be formed by any suitable deposition method on the exposed surfaces of the first bonding pads 988, such as by selective deposition, by lift-off or by non-selective deposition followed by patterning (e.g., photolithographic patterning and etching). The first oxidation barrier layer 992 comprises a material which prevents or reduces oxidation of the first bonding pads by at least 50%. In one embodiment, the oxidation barrier layer may comprise a first carbon-based oxidation barrier layer 992 which includes a first carbon-based oxidation barrier material. The first carbon-based oxidation barrier layer 992 is formed on the physically exposed surfaces of the first bonding pads 988 without forming the first carbon-based oxidation barrier material on the physically exposed surfaces of the first bonding dielectric layer 970. Thus, the first carbon-based oxidation barrier layer 992 may be formed as discrete material portions that are located on a top surface of a respective one of the first bonding pads 988.

As used herein, a carbon-based oxidation barrier material refers to a material that may function as an oxidation barrier for a metallic material and includes carbon atoms at a weight percentage greater than 50%. The carbon-based oxidation barrier material may include carbon atoms at a weight percentage in a range from 50% to 100%, such as from 80% to 99%. The carbon-based oxidation barrier material may consist essentially of carbon, or may include non-carbon atoms. The first carbon-based oxidation barrier layer 992 may be an electrically conductive material, such as graphene or metallic carbon nanotubes. Alternatively, the first carbon-based oxidation barrier layer 992 may be an electrically insulating material which has a sufficiently small thickness which does not substantially increase the resistivity of the interface of the bonding pads after bonding. The first carbon-based oxidation barrier layer 992 may have a thickness in a range from 0.3 nm to 3 nm, although a greater thickness may also be used.

In one embodiment, the first carbon-based oxidation barrier layer 992 may comprise a material consisting essentially of carbon. For example, the first carbon-based oxidation barrier layer 992 may comprise amorphous carbon, diamond-like carbon, graphene, or carbon nanotubes. The carbon atoms of the first carbon-based oxidation barrier material may combine with residual oxygen atoms on, or in, the first bonding pads 988 and second bonding pads of a second semiconductor die to which the first bonding pads 988 are bonded during a subsequent anneal process. The first carbon-based oxidation barrier layer 992 may be formed by a selective chemical vapor deposition process that nucleates the first carbon-based oxidation barrier material on the physically exposed surfaces of the first bonding pads 988 without nucleating the first carbon-based oxidation barrier material on the physically exposed surfaces of the first bonding dielectric layer 970. During the selective chemical vapor deposition (CVD) process, structures formed by assembly of carbon atoms may nucleate only on the metallic surfaces of the first bonding pads 988, and do not nucleate on the physically exposed surfaces of the first bonding dielectric layer 970, thereby forming the first carbon-based oxidation barrier layer 992 only on the physically exposed surfaces of the first bonding pads 992. The selective chemical vapor deposition process may be a thermal chemical vapor deposition process, such as low pressure CVD (LPCVD) or may be a plasma enhanced chemical vapor deposition process (PECVD), such as electron cyclotron resonance CVD (ECR-CVD). For example, graphene may be selectively deposited on copper using LPCVD or ECR-CVD.

In another embodiment, the first carbon-based oxidation barrier layer 992 may be formed by a coating process in which the first carbon-based oxidation barrier material is chemically bonded to the physically exposed surfaces of the first bonding pads 988 without attachment to the physically exposed surfaces of the first bonding dielectric layer 970. In one embodiment, the first carbon-based oxidation barrier layer 992 may include a monolayer of a self-assembly material (SAM). In one embodiment, the self-assembly material may include an alkane thiol precursor compound having a first end with affinity to a material of the first bonding pads 988 and without affinity to a material of the first bonding dielectric layer 970. Thus, the self-assembly material may be self-assembled onto the physically exposed surfaces of the first bonding pads 988 without being attached to the first bonding dielectric layer 970 by depositing a suspension containing the SAM precursors onto the first bonding pads 988 and the first bonding dielectric layer 970. In this case, the first carbon-based oxidation barrier material may decompose partially or completely during a subsequent anneal process in which the first bonding pads 988 are bonded to second bonding pads of a second semiconductor die.

Generally, the first carbon-based oxidation barrier layer 992 prevents or reduces surface oxidation of the material of the first bonding pads 988. By reducing the amount of oxygen incorporated into surface portions of the first bonding pads 988, the first bonding pads 988 may have a greater bonding strength upon bonding to second bonding pads of a second semiconductor die, and a lower resistivity interface between the first and second bonding pads.

Figure 3:
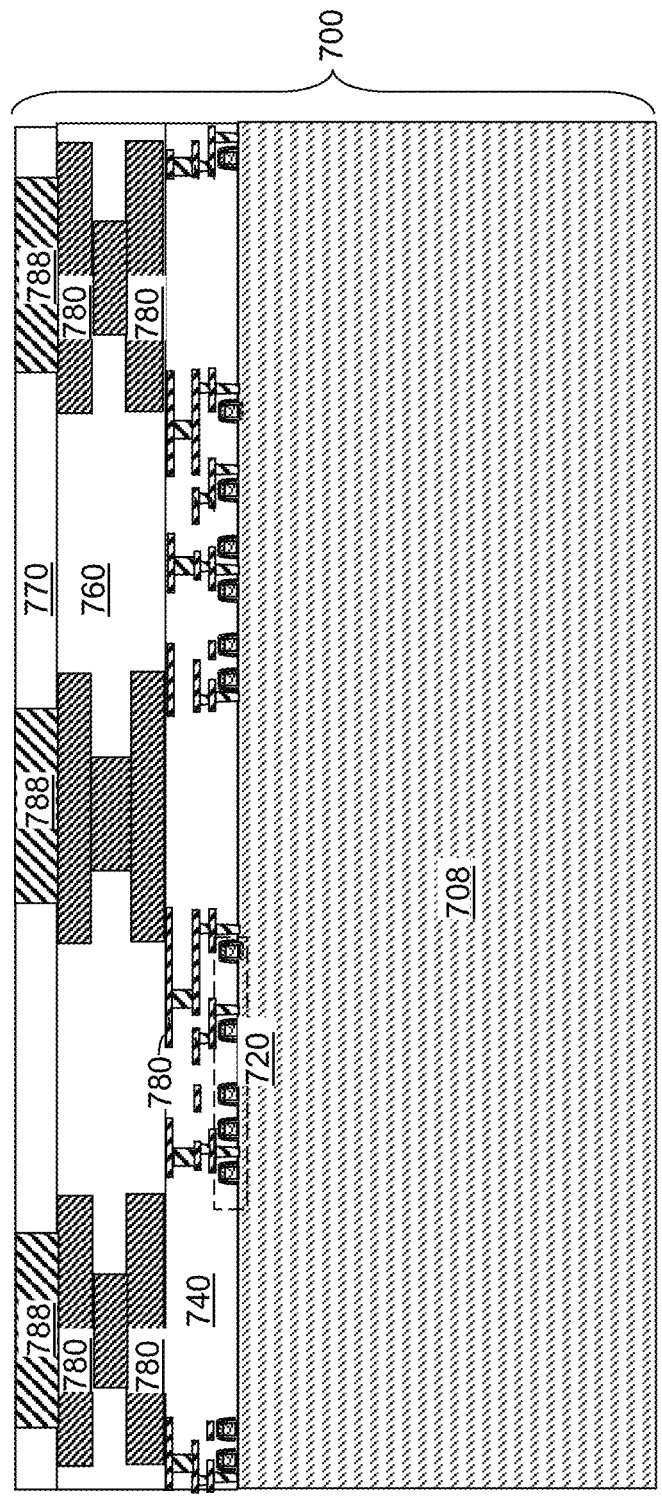
FIG. 3 is a schematic vertical cross-sectional view of a second semiconductor die according to an embodiment of the present disclosure.

Referring to FIG. 3, a second semiconductor die 700 is illustrated. The second semiconductor die 700 includes a second substrate 708, second semiconductor devices 720 overlying the second substrate 708, second dielectric material layers (740, 760, 770) overlying the second semiconductor devices 720, and second metal interconnect structures 780 embedded in the second dielectric material layers (740, 760, 770). In one embodiment, the second semiconductor devices 720 may include at least one complementary metal oxide semiconductor (CMOS) circuitry including field effect transistors. In one embodiment, the second substrate 708 may be a commercially available silicon substrate having a thickness in a range from 500 microns to 1 mm.

Generally, the second semiconductor devices may comprise any semiconductor device that may be operated in conjunction with the first semiconductor devices in the first semiconductor die 900 to provide enhanced functionality. In one embodiment, the first semiconductor die 900 comprises a memory die and the second semiconductor die 700 comprises a logic die that includes a support circuitry (i.e., a peripheral circuitry) for operation of memory devices (such as a three-dimensional array of memory elements) within the memory die. In one embodiment, the first semiconductor die 900 may include a three-dimensional memory device including a three-dimensional array of memory elements, word lines (that may comprise a subset of the electrically conductive lines 46), and bit lines 982, the second semiconductor devices 720 of the second semiconductor die 700 may include a peripheral circuitry for operation of the three-dimensional array of memory elements. The peripheral circuitry may include one or more word line driver circuits that drive the word lines of the three-dimensional array of memory elements of the first semiconductor die 900, one or more bit line driver circuits that drive the bit lines 982 of the first semiconductor die 900, one or more word line decoder circuits that decode the addresses for the word lines, one or more bit line decoder circuits that decode the addresses for the bit lines 982, one or more sense amplifier circuits that sense the states of memory elements within the memory opening fill structures 58 of the first semiconductor die 900, a source power supply circuit that provides power to the horizontal semiconductor channel layer 10 in the first semiconductor die 900, a data buffer and/or latch, and/or any other semiconductor circuit that may be used to operate three-dimensional memory device of the first semiconductor die 900.

The second dielectric material layers (740, 760, 770) may include proximal interconnect-level dielectric layers 740 embedding a proximal subset of the second metal interconnect structures 780 that is proximal to the second substrate 708, distal interconnect-level dielectric layers 760 embedding a distal subset of second metal interconnect structures 780 that is distal from the second substrate 708, and a second bonding dielectric layer 770 that is formed above the distal interconnect-level dielectric layers 760. The second metal interconnect structures 780 may be located within the proximal interconnect-level dielectric layer 740, within the distal interconnect-level dielectric layers 760, or within the second bonding dielectric layer 770.

The proximal interconnect-level dielectric layers 740 and the distal interconnect-level dielectric layers 760 may include a dielectric material such as undoped silicate glass (e.g., silicon oxide), a doped silicate glass, organosilicate glass, silicon nitride, a dielectric metal oxide, or a combination thereof. The second bonding dielectric layer 770 may include undoped silicate glass or a doped silicate glass (e.g., a doped or undoped silicon oxide material). The thickness of the second bonding dielectric layer 770 may be in a range from 100 nm to 3,000 nm, although lesser and greater thicknesses may also be employed. The second bonding dielectric layer 770 may have a planar top surface, which may be provided, for example, by a planarization process such as a chemical mechanical polishing (CMP) process.

Second bonding pads 788 are formed in the second bonding dielectric layer 770, for example, by forming pad cavities in the second bonding dielectric layer 770 and filling the pad cavities with at least one conductive material. Alternatively, the bonding pads 788 are formed on the second metal interconnect structures 780 first, followed by forming the second bonding dielectric layer 770 over and around the second bonding pads 788, followed by planarizing the second bonding dielectric layer 770 to expose the top surface of the second bonding pads 788. The at least one conductive material may be a metallic (i.e., metal or metal alloy) material that may be bonded to the same metallic material or to another metallic material by metal-to-metal or hybrid bonding. For example, each of the first bonding pads 988 may include an optional metallic liner that includes TiN, TaN, and/or WN, and a metal fill material portion that includes the metallic material that may be bonded to the same metallic material or to another metallic material by metal-to-metal bonding. For example, the metal fill material portion may include, and/or consist essentially of, any material selected from Cu, a copper alloy including copper at an atomic concentration greater than 70% (which may be greater than 90% and/or 95%), or a cobalt or nickel alloy, such as CoW, CoWP, CoMoP, NiW, and/or NiWP. The material of the second bonding pads 788 may be the same as, or may be different from, the material of the first bonding pads 988.

Each of the second bonding pads 788 is embedded in the second bonding dielectric layer 770 and contacts a respective underlying one of the second metal interconnect structures 780. Each of the second bonding pads 788 is electrically connected to a respective node of the second semiconductor devices 720.

The types of devices of the first semiconductor die 900 and of the second semiconductor die 700 may be selected in any manner such that the devices 920 of the first semiconductor die 900 and the devices 720 of the second semiconductor die 700 may communicate with each other, and control, and or are controlled by, devices in the other semiconductor die. In one embodiment, one of the first semiconductor die 900 and the second semiconductor die 700 comprises a memory die including memory elements, such as a three-dimensional array of memory elements, and another of the first semiconductor die 900 and the second semiconductor die 700 comprises a logic die including peripheral circuitry configured to operate the memory elements, such as the three-dimensional array of memory elements.

Figure 4:
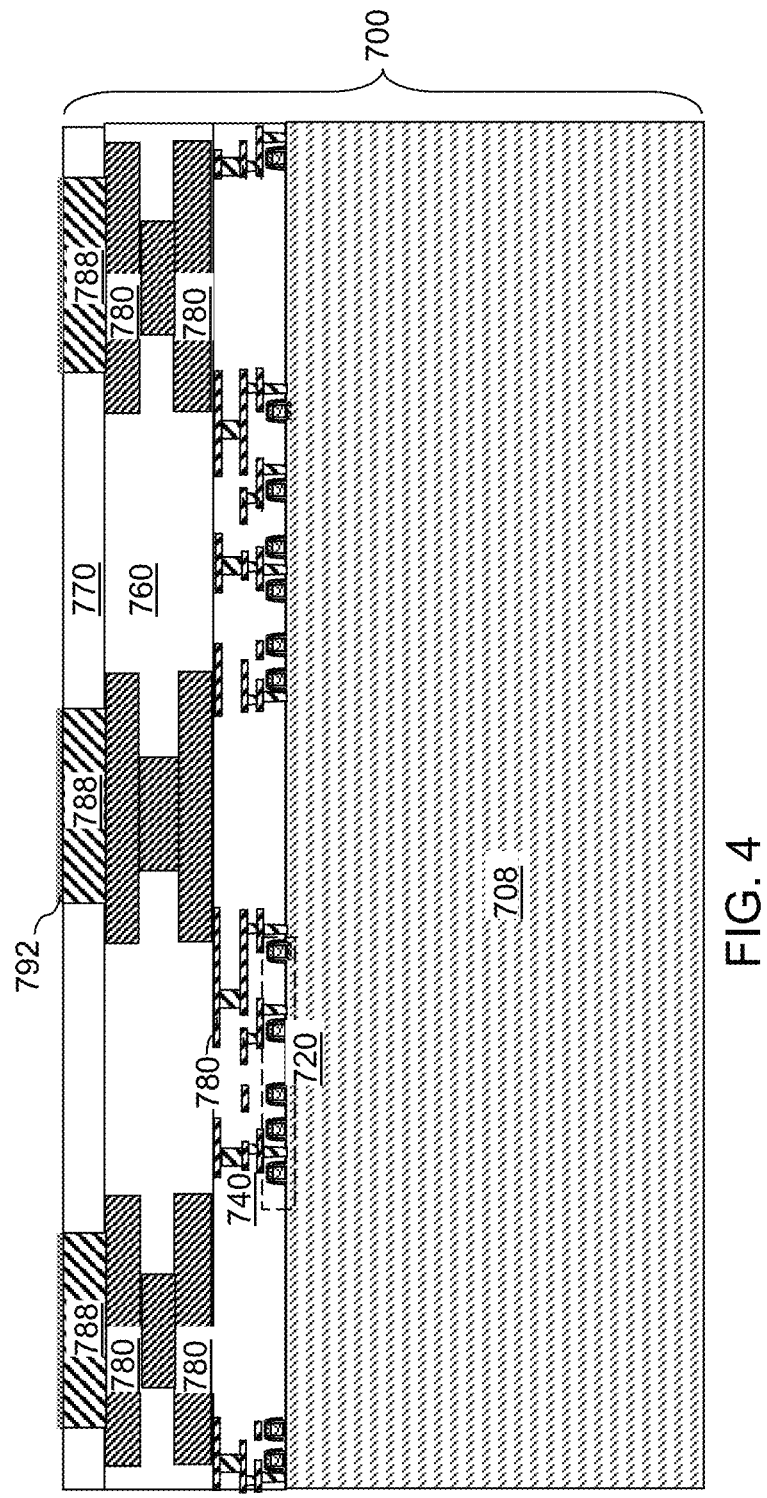
FIG. 4 is a schematic vertical cross-sectional view of the second semiconductor die after selective formation of a second carbon-based oxidation barrier layer according to an embodiment of the present disclosure.

Referring to FIG. 4, a second oxidation barrier layer 792 may be optionally formed on the physically exposed surfaces (e.g., top surface) of the second bonding pads 788. The second oxidation barrier layer 792 (if present) may be the same as or different from the material of the first oxidation barrier layer 992. The second oxidation barrier layer 792 may be formed by any suitable deposition method on the exposed surfaces of the second bonding pads 788, such as by selective deposition, by lift-off or by non-selective deposition followed by patterning (e.g., photolithographic patterning and etching). The second oxidation barrier layer 792 comprises a material which prevents or reduces oxidation of the second bonding pads by at least 50%. In one embodiment, the second oxidation barrier layer may comprise a second carbon-based oxidation barrier layer 792 which includes a second carbon-based oxidation barrier material, as defined above with respect to the first carbon-based oxidation barrier layer 992. The second carbon-based oxidation barrier layer 792 is formed on the physically exposed surfaces of the second bonding pads 788 without forming the second carbon-based oxidation barrier material on the physically exposed surfaces of the second bonding dielectric layer 770. Thus, the second carbon-based oxidation barrier layer 792 may be formed as discrete material portions that are located on a top surface of a respective one of the second bonding pads 788. The second carbon-based oxidation barrier layer 792 may have a thickness in a range from 0.3 nm to 3 nm, although a greater thickness may also be used.

In one embodiment, the second carbon-based oxidation barrier layer 792 may comprise a material consisting essentially of carbon. For example, the second carbon-based oxidation barrier layer 792 may comprise amorphous carbon, diamond-like carbon, graphene, or carbon nanotubes. The carbon atoms of the second carbon-based oxidation barrier material may combine with residual oxygen atoms on, or in, the second bonding pads 788 and the first bonding pads 988 to which the second bonding pads 788 are bonded during a subsequent anneal process. The second carbon-based oxidation barrier layer 792 may be formed by a selective chemical vapor deposition process that nucleates the second carbon-based oxidation barrier material on the physically exposed surfaces of the second bonding pads 788 without nucleating the second carbon-based oxidation barrier material on the physically exposed surfaces of the second bonding dielectric layer 770. During the selective chemical vapor deposition (CVD) process, structures formed by assembly of carbon atoms may nucleate only on the metallic surfaces of the second bonding pads 788, and do not nucleate on the physically exposed surfaces of the second bonding dielectric layer 770, thereby forming the second carbon-based oxidation barrier layer 792 only on the physically exposed surfaces of the second bonding pads 792. The selective chemical vapor deposition process may be a thermal chemical vapor deposition process, or may be a plasma-assisted chemical vapor deposition process (PECVD), such as electron cyclotron resonance CVD (ECR-CVD). For example, graphene may be selectively deposited on copper using LPCVD or ECR-CVD.

In another embodiment, the second carbon-based oxidation barrier layer 792 may be formed by a coating process in which the second carbon-based oxidation barrier material is chemically bonded to the physically exposed surfaces of the second bonding pads 788 without attachment to the physically exposed surfaces of the second bonding dielectric layer 770. In one embodiment, the second carbon-based oxidation barrier layer 792 may include a monolayer of a self-assembly material (SAM). In one embodiment, the self-assembly material may include an alkane thiol precursor compound having a first end with affinity to a material of the second bonding pads 788 and without affinity to a material of the second bonding dielectric layer 770. Thus, the self-assembly material may be self-assembled onto the physically exposed surfaces of the second bonding pads 788 without being attached to the second bonding dielectric layer 770

In one embodiment, the first carbon-based oxidation barrier layer 992 may include a first self-assembly material having a first end having a first head group attached to the first bonding pads 988, and a second end having a first terminal (i.e., tail) group. The second carbon-based oxidation barrier layer 792 may include a second self-assembly material having a first end having a second head group attached to the second bonding pads 788, and a second end having a second terminal (i.e., tail) group configured to chemically bond to the first terminal group of the first self-assembly material. The first head group may be the same as or different from the second head group. The first terminal group may be the same or different from the second terminal group. In one embodiment, the second carbon-based oxidation barrier material may decompose partially or completely during a subsequent anneal process in which the second bonding pads 788 are bonded to the first bonding pads 988 of the first semiconductor die 900.

Generally, the second carbon-based oxidation barrier layer 792 prevents or reduces surface oxidation of the material of the second bonding pads 788. By reducing the amount of oxygen incorporated into surface portions of the second bonding pads 788, the second bonding pads 788 may have a greater bonding strength upon bonding to the first bonding pads 988 of the first semiconductor die 900, and a lower resistivity interface between the first and second bonding pads.

Figure 5:
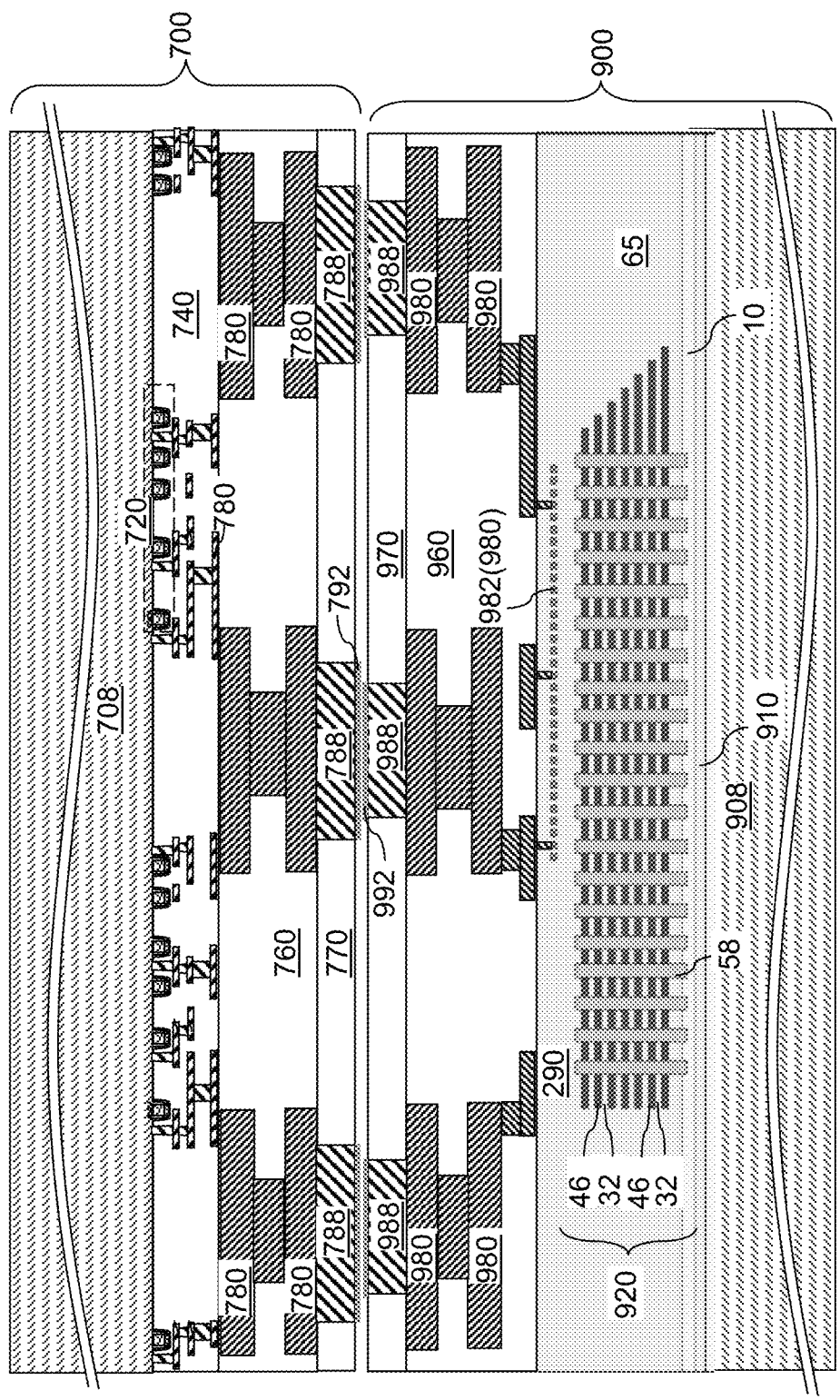
FIG. 5 is a schematic vertical cross-sectional view of an exemplary structure including the first semiconductor die and the second semiconductor die after disposing the second bonding pads over the first bonding pads according to an embodiment of the present disclosure.

Referring to FIG. 5, the first semiconductor die 900 and the second semiconductor die 700 are oriented such that the first bonding dielectric layer 970 faces the second bonding dielectric layer 770. The second semiconductor die 700 and the first semiconductor die 900 are brought into contact such that a surface of the second dielectric material layers (740, 760, 770) (such as a surface of the second bonding dielectric layer 770) contacts a surface of the first dielectric material layers (290, 960, 970) (such as a surface of the first bonding dielectric layer 970). The first semiconductor die 900 and the second semiconductor die 700 may be laterally aligned such that each second bonding pad 788 faces a respective one of the first bonding pads 988. In one embodiment, the pattern of the second bonding pads 788 may be a mirror image of the pattern of the first bonding pads 988 with optional differences in the size of bonding pads between the first semiconductor die 900 and the second semiconductor die 700. In one embodiment, the first bonding pads 988 and the corresponding second bonding pads 788 may have the same size (i.e., lateral width). In another embodiment, the first bonding pads 988 and the corresponding second bonding pads 788 may have different sizes. In one embodiment, areal overlap between each facing pair of a first bonding pad 988 and a second bonding pad 788 may be at least 80%, and/or at least 90%, such as 90 to 100%, of the area of the smaller one of the first bonding pad 988 and the second bonding pad 788.

Figure 6B:
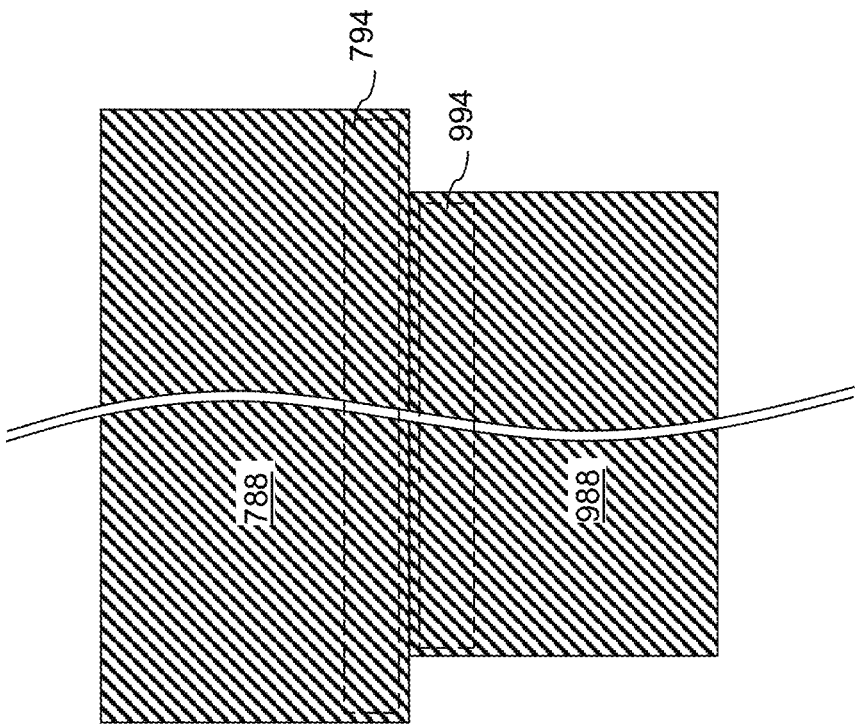
FIG. 6B is a magnified view of the mating pair of the first bonding pad and the second bonding pad in the first configuration after the second bonding pad is bonded to the first bonding pad.
Figure 6A:
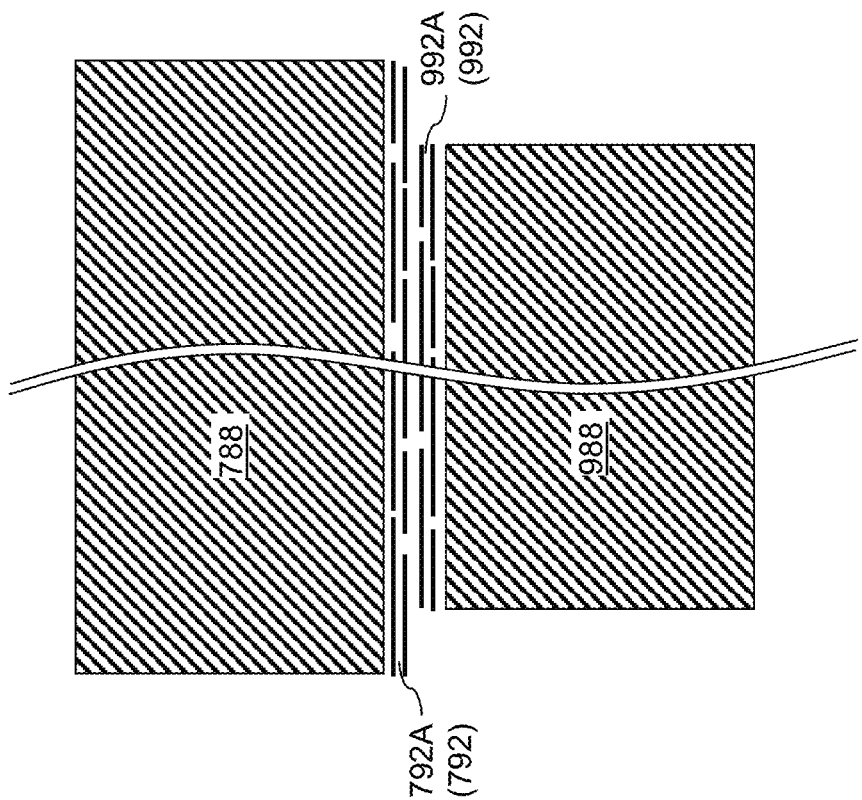
FIG. 6A is a magnified view of a mating pair of a first bonding pad and a second bonding pad at the processing step of FIG. 5 in a first configuration in which the first and second carbon-based oxidation barrier layers comprise a two-dimensional carbon-containing material.

Referring to FIG. 6A, a magnified view of a mating pair of a first bonding pad 988 and a corresponding second bonding pad 788 is shown at the processing step of FIG. 5 in a first configuration, in which the first and second carbon-based oxidation barrier layers (992, 792) comprise a two-dimensional carbon-containing material. In this case, each portion of the first carbon-based oxidation barrier layer 992 may be a portion of a first two-dimensional carbon-containing material layer 992A having a thickness in a range from 0.3 nm to 3 nm, consisting essentially of carbon, and including material selected from amorphous carbon, diamond-like carbon, graphene, and carbon nanotubes. Each portion of the second carbon-based oxidation barrier layer 792 may be a portion of a second two-dimensional carbon-containing material layer 792A having a thickness in a range from 0.3 nm to 3 nm, consisting essentially of carbon, and including material selected from amorphous carbon, diamond-like carbon, graphene, and carbon nanotubes.

Referring to FIG. 6B, the second bonding pads 788 may be bonded to the first bonding pads 988 by performing an anneal process that induces metal-to-metal bonding between the second bonding pads 788 and the first bonding pads 988 and optionally dielectric bonding between the respective bonding dielectric layers 970 and 770. Generally, the second bonding pads 788 may be bonded to the first bonding pads 988 with at least the first carbon-based oxidation barrier layer 992 there between. In one embodiment, only the first carbon-based oxidation barrier layer 992 is present between a mating pair of a first bonding pad 988 and a second bonding pad 788. In another embodiment, the first carbon-based oxidation barrier layer 992 and the second carbon-based oxidation barrier layer 792 are present between a mating pair of a first bonding pad 988 and a second bonding pad 788. The first carbon-based oxidation barrier material and the second carbon-based oxidation barrier material, if present, may optionally diffuse into the first bonding pads 988 and the second bonding pads during bonding 788 during the bonding process, and/or the bonding pad metal, such as copper may diffuse into the first and/or second carbon-based oxidation barrier material.

The anneal temperature may be selected based on the composition of the second bonding pads 788 and the first bonding pads 988. For example, if the second bonding pads 788 and the first bonding pads 988 include metal fill portions that consist essentially of copper, the anneal temperature may be in a range from 150 degrees Celsius to 400 degrees Celsius. Residual oxygen atoms on, or in, the first bonding pads 988 and the second bonding pads 788 may combine with the first and/or carbon-based oxidation barrier material, such as graphene during the anneal. For example, the oxygen atoms may diffuse from the bonding pads through the graphene via Stone-Wales defects and form a carboxyl group on the graphene surface which may aid in the bonding process. The graphene may also improve the resistance and breakdown current density of copper in the bonding pads.

An optional first interfacial region 994 may be formed in a surface portion of each first bonding pad 988, and/or an optional second interfacial region 794 may be formed in a surface portion of each second bonding pad 788. Each interfacial region (994, 794) may include carbon atoms provided from the first carbon-based oxidation barrier layer 992 and the optional second carbon-based oxidation barrier layer 792. Each bonded pair of a first bonding pad 988 and a second bonding pad 788 may include a respective interfacial region (994, 794) that includes volumes that are within 10 nm from an interface between the first bonding pad 988 and the second bonding pad 788. In one embodiment, each interfacial region (994, 794) may have an average volume carbon density that is greater than $1.0 \times 10^{16}/cm^3$, such as $5 \times 10^{16}/cm^3$ to $1 \times 10^{22}/cm^3$.

In one embodiment, oxide-to-oxide bonding may optionally simultaneously occur between the first bonding dielectric layer 970 and the second bonding dielectric layer 770 during bonding of the second bonding pads 788 to the first bonding pads 988. In this hybrid bonding embodiment, the second bonding dielectric layer 970 may be bonded to the first bonding dielectric layer 770 during bonding of the second bonding pads 988 to the first bonding pads 988 via oxide-to-oxide bonding.

Referring to FIG. 7A, a magnified view of a mating pair of a first bonding pad 988 and a second bonding pad 788 is shown at the processing step of FIG. 5 in a second configuration, in which the first and second carbon-based oxidation barrier layers (922, 722) comprise self-assembly materials. In this case, each portion of the first carbon-based oxidation barrier layer 992 may be a portion of a first carbon-containing self-assembly material layer 992B formed by a coating process in which a first carbon-based oxidation barrier material is attached to the physically exposed surfaces of the first bonding pads 988 without attachment to the physically exposed surfaces of the first bonding dielectric layer 970. Likewise, each portion of the second carbon-based oxidation barrier layer 792 may be a portion of a second carbon-containing self-assembly material layer 792B formed by a coating process in which a second carbon-based oxidation barrier material is attached to the physically exposed surfaces of the second bonding pads 788 without attachment to the physically exposed surfaces of the second bonding dielectric layer 770. In one embodiment, each of the first carbon-containing self-assembly material layer 992B and the second carbon-containing self-assembly material layer 792B may include a monolayer of a self-assembly material (SAM), which may include an alkane compound having a first end with affinity to a material of the first bonding pads 988 or the second bonding pads 788 and without affinity to a material of the first bonding dielectric layer 970 or the second bonding dielectric layer 770. In one embodiment, each of the first carbon-containing self-assembly material layer 992B and the second carbon-containing self-assembly material layer 792B may include carbon atoms at a weight percentage greater than 50%.

In one embodiment, the first carbon-containing self-assembly material layer 992B and the second carbon-containing self-assembly material layer 792B may include a monolayer of an alkane thiol having a chemical formula of $CH_3(CH_2)_{n-1}SH$.

Referring to FIG. 7B, a magnified view of a mating pair of a first bonding pad 988 and a second bonding pad 788 is shown at the processing step of FIG. 5 in a third configuration. The first and second carbon-based oxidation barrier layers (992, 792) comprise self-assembly materials as in the second configuration illustrated in FIG. 7A. In this case, the first carbon-containing self-assembly material layer 992B may include a monolayer of a first self-assembly material. The first self-assembly material may include an alkane compound having a first end (i.e., a first head group) with affinity to a material of the first bonding pads 988 and without affinity to the material of the first bonding dielectric layer 970 and having a second end (i.e., a first tail group). The second carbon-containing self-assembly material layer 792B may include a monolayer of a second self-assembly material. The second self-assembly material may include an alkane compound having a first end (i.e., a second head group) with affinity to a material of the second bonding pads 788 and without affinity to the material of the second bonding dielectric layer 770 and having a second end (i.e., a second tail group). The second end (e.g., second tail group A) of the second self-assembly material may include a functional group that is selectively bonded to a functional group of the second end (e.g., the first tail group B) of the first self-assembly material. For example, a self-assembly material may include a thiol (e.g., sulfur containing) head group configured to bond to a copper bonding pad, a $CH_2$ backbone and a methyl ($CH_3$) or a hydroxide tail group configured to bind to another similar or different tail group of the corresponding SAM bonded to the opposing corresponding bonding pad. In this embodiment, the opposing SAMs (792B, 992B) function as adhesion layers which bond to each other and improve the adhesion between the opposing bonding pads.

Figure 7C:
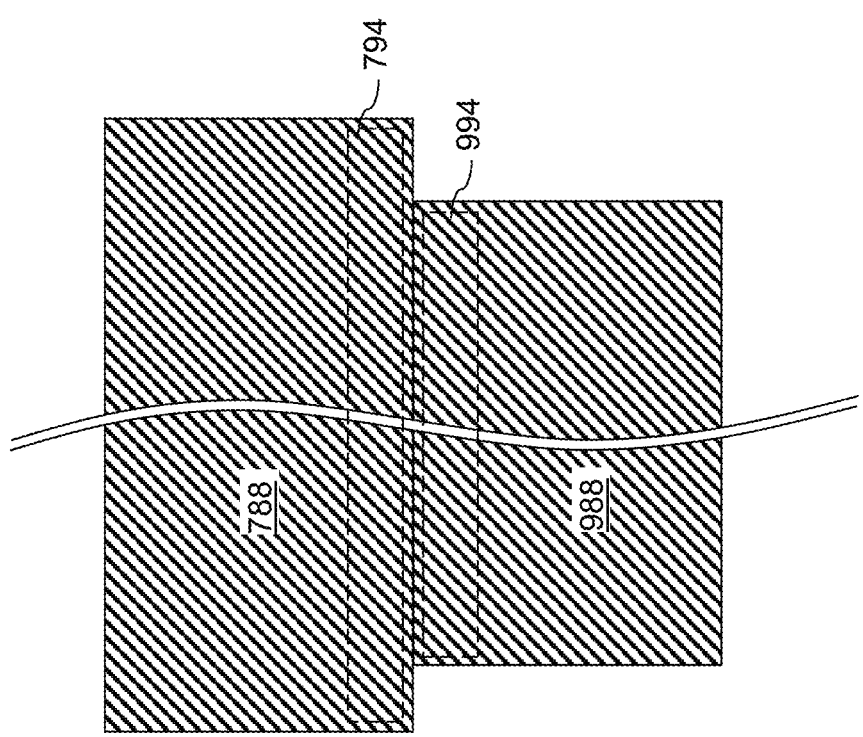
FIG. 7C is a magnified view of the mating pair of the first bonding pad and the second bonding pad in the second configuration or in the third configuration after the second bonding pad is bonded to the first bonding pad.

Referring to FIG. 7C, the second bonding pads 788 may be bonded to the first bonding pads 988 by performing an anneal process that induces metal-to-metal bonding between the second bonding pads 788 and the first bonding pads 988. The same processing steps may be used as the processing steps of FIG. 6B. The first carbon-based oxidation barrier layer 992 (comprising the first carbon-containing self-assembly material layer 992B) and the second carbon-based oxidation barrier layer 792 (comprising the second carbon-containing self-assembly material layer 792B) are present between a mating pair of a first bonding pad 988 and a second bonding pad 788. The first carbon-based oxidation barrier material and the second carbon-based oxidation barrier material may break apart into individual atoms and/or groups of atoms, and diffuse into the first bonding pads 988 and the second bonding pads 788 during the bonding process.

The carbon atoms, in combination with oxygen atoms and/or hydrogen atoms and/or additional atoms such as nitrogen and/or sulfur provided in the first and second carbon-containing self-assembly material layers (992B, 792B), or in an atomic form, are distributed in surface regions of the first bonding pads 988 and in surface regions of the second bonding pads 788. An optional first interfacial region 994 may be formed in a surface portion of each first bonding pad 988, and/or an optional second interfacial region 794 may be formed in a surface portion of each second bonding pad 788. Each interfacial region (994, 794)

may include carbon atoms provided from the first carbon-based oxidation barrier layer 992 and the optional second carbon-based oxidation barrier layer 792. Each bonded pair of a first bonding pad 988 and a second bonding pad 788 includes a respective interfacial region (994, 794) that includes volumes that are within 10 nm from an interface between the first bonding pad 988 and the second bonding pad 788. In one embodiment, each interfacial region (994, 794) may have an average volume carbon density that is greater than $1.0 \times 10^{16}/cm^3$, such as $5 \times 10^{16}/cm^3$ to $1 \times 10^{22}/cm^3$. The SAMs may serve as adhesion layers that enhance the bond strength of the bonding pads to the bonding dielectric layer of the opposing die if the size and/or relative position of the paid of corresponding bonding pads are different or offset. The SAMs may prevent or reduce metal (e.g., copper diffusion) from the bonding pads into the bonding dielectric layer of the opposing die if the size and/or relative position of the paid of corresponding bonding pads are different or offset. The SAMs may also protect the bonding pads from oxidation and contamination.

In one embodiment, oxide-to-oxide bonding may simultaneously occur between the first bonding dielectric layer 970 and the second bonding dielectric layer 770 during bonding of the second bonding pads 788 to the first bonding pads 988. In this hybrid bonding case, the second bonding dielectric layer 970 may be bonded to the first bonding dielectric layer 770 during bonding of the second bonding pads 988 to the first bonding pads 788 via oxide-to-oxide bonding.

Figure 8:
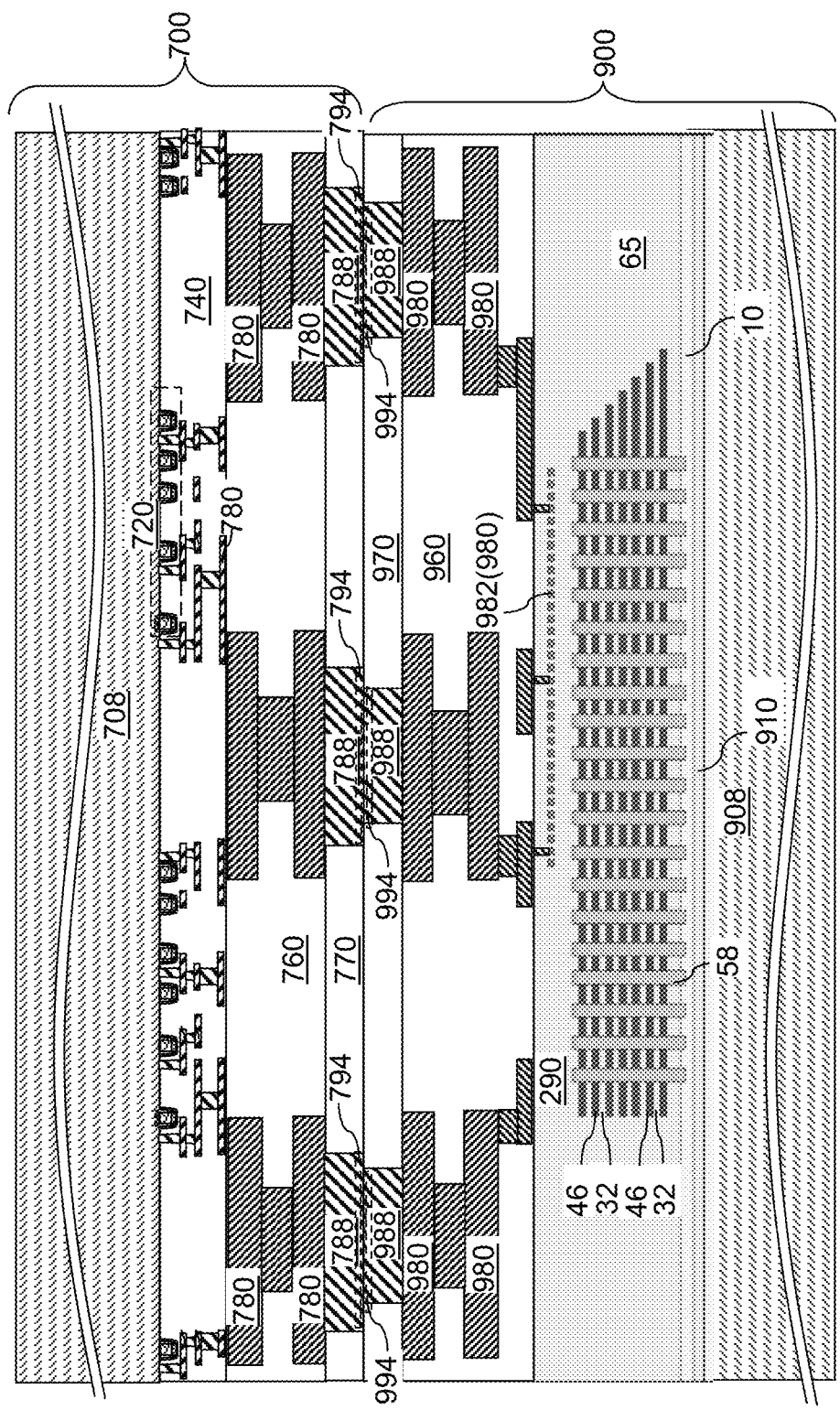
FIG. 8 is a schematic vertical cross-sectional view of the exemplary structure at the processing step of FIG. 6B or FIG. 7C according to an embodiment of the present disclosure.

Referring to FIG. 8, a bonded assembly including the first semiconductor die 900 and the second semiconductor die 700 is illustrated after the processing steps of FIG. 6B or after the processing steps of FIG. 7C. This completes the bonding process. Alternatively, additional process steps may be performed as described below with respect to FIG. 9.

Figure 9:
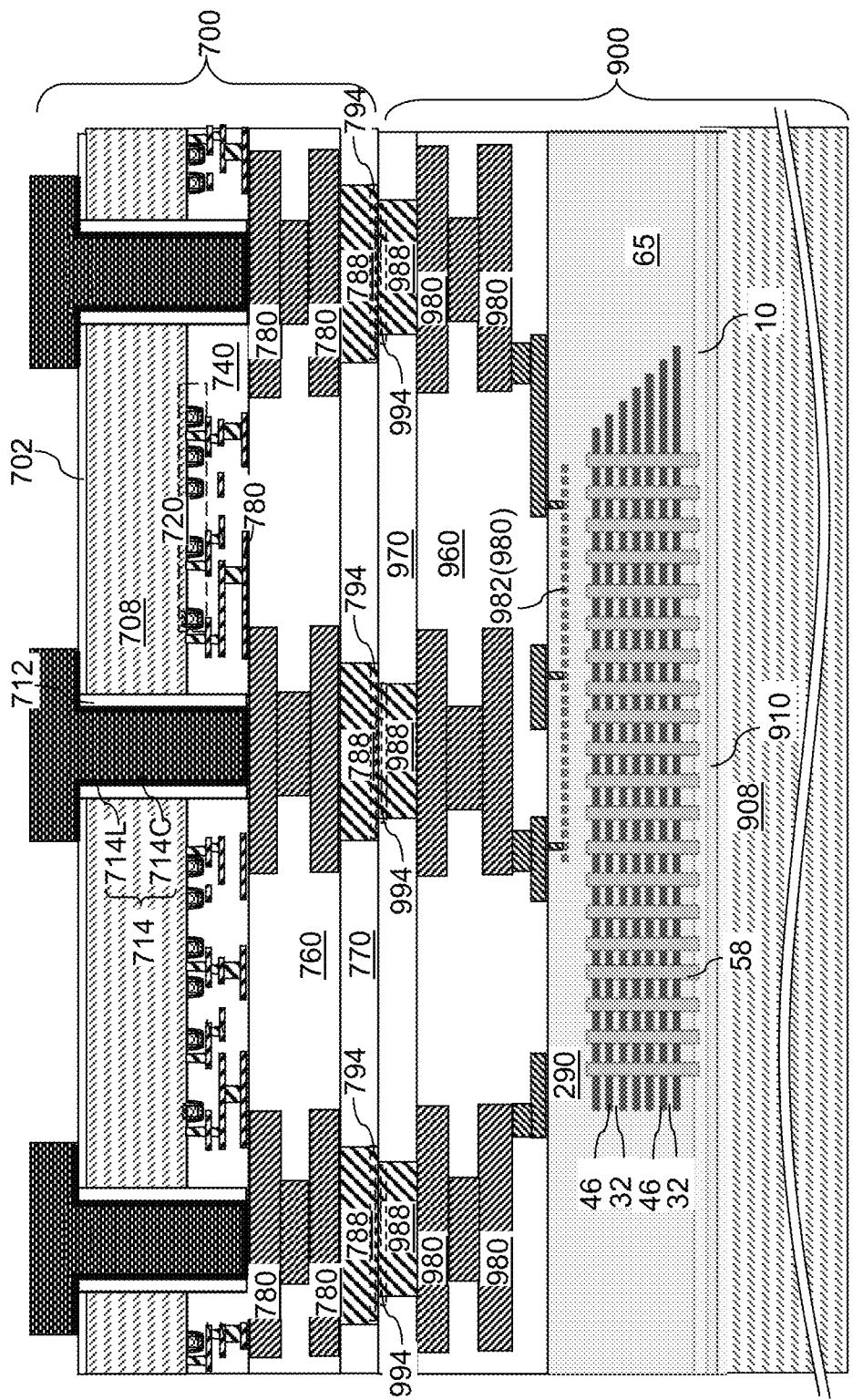
FIG. 9 is a schematic vertical cross-sectional view of the exemplary structure after thinning the first substrate and forming through-substrate via structures through the first substrate according to an embodiment of the present disclosure.

Referring to FIG. 9, optional through-substrate contact via structures 714 may be formed through the second substrate 708 or through the first substrate 908. The second substrate 708 (or the first substrate 908) may be thinned from the backside by grinding, polishing, an anisotropic etch, or an isotropic etch. A backside insulating layer 702 may be formed on the backside of the second substrate 708. A photoresist layer (not shown) may be applied on the backside of the second substrate 708, and may be lithographically patterned to form opening therethrough. The location of the openings through the patterned photoresist layer may be selected such that each opening through the photoresist layer is located entirely within the area of a respective one of the second metal interconnect structures 780.

An anisotropic etch process may be performed using the patterned photoresist layer as an etch mask layer. The anisotropic etch process may etch through unmasked regions of the second substrate 708 and through the proximal interconnect-level dielectric material layers 740. The etch chemistries of the various steps of the anisotropic etch process may be selected to etch through the various unmasked material portions, and the terminal step of the anisotropic etch process may include an etch chemistry that anisotropically etches one of the proximal interconnect-level dielectric material layers 740 selective to the metallic material of the second metal interconnect structures.

Via cavities extending at least through the second substrate 708 and the proximal interconnect-level dielectric material layers 740 may be formed. The via cavities are herein referred to as through-substrate via cavities. Each of the through-substrate via cavities may include a respective vertical or substantially vertical sidewall, and vertically extends from the backside surface of the second substrate 708 to a proximal surface of a respective one of the second metal interconnect structures 780, which may be a metal pad. Thus, a proximal surface of a second metal interconnect structure 780 (such as a proximal surface of a bonding pad) is physically exposed at the bottom of each through-substrate via cavity.

At least one electrically conductive material such as at least one metallic material may be deposited in the through-substrate via cavities. The at least one conductive material may include, for example, a metallic nitride liner material such as TiN, TaN, and/or WN, and a metallic fill material such as W, Co, Cu, Ru, and/or Mo. The at least one conductive material may be deposited by physical vapor deposition or chemical vapor deposition or atomic layer deposition or electrochemical deposition or electro-less deposition or combinations thereof. The at least one conductive material may be patterned into discrete portions to provide through-substrate via structures 714. The upper portion of each through-substrate via structure 714 that protrudes above the backside insulating layer 702 includes a metallic pad structure, which may be used as an external bonding pad. Each through-substrate via structure 714 may include a metallic nitride liner 714L and a metallic fill material portion 714C.

Referring to all drawings and according to various embodiments of the present disclosure, a bonded assembly is provided, which comprises: a first semiconductor die 900 comprising a first substrate 908, first semiconductor devices 920, and first bonding pads 988 that are electrically connected to a respective node of the first semiconductor devices 920, and a second semiconductor die 700 comprising a second substrate 708, second semiconductor devices 720, and second bonding pads 788 that are electrically connected to a respective node of the second semiconductor devices. Each of the second bonding pads 788 is bonded to a respective one of the first bonding pads 988. Each bonded pair of a first bonding pad 988 and a second bonding pad 788 includes an interfacial region 994 and/or 794 that includes volumes that are within 10 nm from an interface between the first bonding pad 988 and the second bonding pad 788. Each interfacial region has an average volume carbon density that is greater than $1.0 \times 10^{16}/cm^3$.

In one embodiment, the first bonding pads 988 are located within a first bonding dielectric layer 970, the second bonding pads 788 are located within a second bonding dielectric layer 770, the first bonding dielectric layer 970 and the second bonding dielectric layer 770 comprise silicon oxide, and the second bonding dielectric layer 770 is bonded to the first bonding dielectric layer 970 via oxide-to-oxide bonding.

In one embodiment, if the first carbon-based oxidation barrier layer 992 and/or for the second carbon-based oxidation barrier layer 792 remain intact and do not entirely diffuse into the first and/or second bonding pads, then each interfacial region 994 and/or 794 contains a carbon containing layer 992 and/or 792.

In one embodiment, each interfacial region 994 and/or 794 may contain graphene or carbon nanotubes. In one embodiment, in case graphene or a carbon nanotubes are provided in the first carbon-based oxidation barrier layer 992 and/or in the second carbon-based oxidation barrier layer 792, then the layers 992 and/or 792 may be disrupted during bonding to leave clusters of carbon atoms within the interfacial regions (994, 794). In one embodiment, at least 50% of all carbon atoms in each interfacial region (994, 794) is within a respective two-dimensional cluster of carbon atoms in which carbon atoms are boned to each other in a hexagonal lattice structure (e.g., residual portion of graphene or clusters of carbon nanotubes).

In another embodiment, if the self-assembly material is provided in the first carbon-based oxidation barrier layer 992 and/or in the second carbon-based oxidation barrier layer 792, then each interfacial region may contain a least one of an alkane compound and/or a thiol compound if the SAM layers decompose during bonding. Hydrogen atoms and other atoms derived from the self-assembly material may be present in the interfacial regions (994, 794). In one embodiment, each interfacial region (994, 794) may have an average volume hydrogen density that is greater than $1.0 \times 10^{16}/\text{cm}^3$.

In one embodiment, the first semiconductor die 900 comprises first dielectric material layers (290, 860, 970) located on the first semiconductor devices and embedding first metal interconnect structures 980, the first bonding pads 988 are electrically connected to a respective one of the first metal interconnect structures 980, the second semiconductor die 700 comprises second dielectric material layers (740, 760, 770) located on the second semiconductor devices and embedding second metal interconnect structures 780, and the second bonding pads 788 are electrically connected to a respective one of the second metal interconnect structures 780.

In one embodiment, one of the first semiconductor die 900 and the second semiconductor die 700 comprises a memory die including a three-dimensional array of memory elements, and another one of the first semiconductor die and the second semiconductor die comprises a logic die including a peripheral circuitry configurated to operate the three-dimensional array of memory elements.

The first carbon-based oxidation barrier layer 992 and/or for the second carbon-based oxidation barrier layer 792 may reduce oxidation of the first bonding pads 988 and/or the second bonding pads 788, thereby enhancing the bonding strength between the first bonding pads 988 and the second bonding pads 788. Further, reduction of oxygen density in the interfacial regions (994, 794) may reduce the interfacial resistance of the bonded pairs of a first bonding pad 988 and a second bonding pad 788, thereby improving current flow between the first semiconductor die 900 and the second semiconductor die 700.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A method of forming a bonded assembly, comprising:
   providing a first semiconductor die comprising a first substrate, first semiconductor devices, and first bonding pads that are electrically connected to a respective node of the first semiconductor devices, located in a first bonding dielectric layer, and comprise physically exposed surfaces located above a horizontal plane including a bottom surface of the first bonding dielectric layer;
   forming a first carbon-based oxidation barrier layer on the physically exposed surfaces of the first bonding pads by performing a selective deposition process that selectively deposits a first carbon-based oxidation barrier material that includes carbon at a weight percentage greater than 50% without forming the first carbon-based oxidation barrier layer on physically exposed surfaces of the first bonding dielectric layer;
   providing a second semiconductor die comprising a second substrate, second semiconductor devices, and second bonding pads that are electrically connected to a respective node of the second semiconductor devices; and
   bonding the second bonding pads to the first bonding pads with at least the first carbon-based oxidation barrier layer located between the respective first and second bonding pads, wherein metal-to-metal bonding occurs between the second bonding pads and the first bonding pads while the first carbon-based oxidation barrier material, or individual atoms or groups of atoms of the carbon-containing material formed by breakage of the first carbon-based oxidation barrier material, diffuse into the first bonding pads and into the second bonding pads during a bonding process and carbon atoms from the first carbon-based oxidation barrier material are distributed in surface regions of the second bonding pads and the first bonding pads.

2. The method of claim 1, wherein:
   the second bonding pads are located within a second bonding dielectric layer.

3. The method of claim 2, wherein the carbon-based oxidation barrier layer has a thickness in a range from 0.3 nm to 3 nm.

4. The method of claim 3, wherein the first carbon-based oxidation barrier layer includes a material selected from amorphous carbon, diamond-like carbon, graphene, and carbon nanotubes.

5. The method of claim 4, wherein:
   bonding the second bonding pads to the first bonding pads comprises performing an anneal process in which residual oxygen atoms on, or in, the first bonding pads combine with the first carbon-based oxidation barrier material; and
   the first carbon-based oxidation barrier material diffuses into the first bonding pads during the bonding.

6. The method of claim 4, wherein the first carbon-based oxidation barrier layer is formed by a selective chemical vapor deposition process that nucleates the first carbon-based oxidation barrier material on the physically exposed surfaces of the first bonding pads without nucleating the first carbon-based oxidation barrier material on the physically exposed surfaces of the first bonding dielectric layer.

7. The method of claim 6, wherein the selective chemical vapor deposition process comprises a process selected from a thermal chemical vapor deposition process or a plasma enhanced chemical vapor deposition process (PECVD).

8. The method of claim 3, wherein the first carbon-based oxidation barrier layer comprises a monolayer of a first self-assembly material (SAM) including an alkane compound having a first end with affinity to a material of the first bonding pads and without affinity to a material of the first bonding dielectric layer.

9. The method of claim 8, wherein bonding the second bonding pads to the first bonding pads comprises performing an anneal process in which the first carbon-based oxidation barrier material decomposes.

10. The method of claim 8, wherein the first carbon-based oxidation barrier layer is formed by a self-assembly process in which the first carbon-based oxidation barrier material is attached to the physically exposed surfaces of the first bonding pads without attachment to the physically exposed surfaces of the first bonding dielectric layer.

11. The method of claim 8, further comprising selectively forming a second carbon-based oxidation barrier layer comprising a second monolayer of a self-assembly material (SAM) on physically exposed surfaces of the second bonding pads without forming the second carbon-based oxidation barrier material on physically exposed surfaces of the second bonding dielectric layer, wherein the first and second carbon-based oxidation barrier layers bond to each other and function as adhesion layers.

12. The method of claim 2, wherein:
the first bonding dielectric layer and the second bonding dielectric layer comprise silicon oxide; and
the second bonding dielectric layer is bonded to the first bonding dielectric layer during bonding the second bonding pads to the first bonding pads via oxide-to-oxide bonding.

13. The method of claim 2, further comprising selectively forming a second carbon-based oxidation barrier layer on physically exposed surfaces of the second bonding pads without forming the second carbon-based oxidation barrier material on physically exposed surfaces of the second bonding dielectric layer,
wherein the second bonding pads are bonded to the first bonding pads with the first carbon-based oxidation barrier layer and the second carbon-based oxidation barrier layer therebetween; and
wherein the second carbon-based oxidation barrier material diffuse into the first bonding pads and the second bonding pads during bonding.

14. The method of claim 1, wherein each of the first bonding pads and the second bonding pads comprises a metallic material portion consisting essentially of Cu, a copper alloy including copper at an atomic concentration greater than 70%, CoW, CoWP, CoMoP, NiW, or NiWP.

15. The method of claim 1, wherein:
one of the first semiconductor die and the second semiconductor die comprises a memory die including a three-dimensional array of memory elements; and
another one of the first semiconductor die and the second semiconductor die comprises a logic die including a peripheral circuitry configured to operate the three-dimensional array of memory elements.

16. The method of claim 1, wherein the first carbon-based oxidation barrier layer is formed by a coating process in which the first carbon-based oxidation barrier material is chemically bonded to the physically exposed surfaces of the first bonding pads without attachment to the physically exposed surfaces of the first bonding dielectric layer.

* * * * *